US010026495B2

(12) United States Patent
Moon et al.

(10) Patent No.: US 10,026,495 B2
(45) Date of Patent: Jul. 17, 2018

(54) METHOD OF CONTROLLING MAGNETIZATION STATE USING IMPRINTING TECHNIQUE

(71) Applicant: Korea Research Institute of Standards and Science, Daejeon (KR)

(72) Inventors: Kyoung Woong Moon, Daejeon (KR); Chan Yong Hwang, Seoul (KR)

(73) Assignee: Korea Research Institute of Standards and Science, Daejeon (KR)

( * ) Notice: Subject to any disclaimer, the term of this patent is extended or adjusted under 35 U.S.C. 154(b) by 0 days.

(21) Appl. No.: 15/606,910

(22) Filed: May 26, 2017

(65) Prior Publication Data
US 2017/0345514 A1    Nov. 30, 2017

(30) Foreign Application Priority Data

May 30, 2016  (KR) .................. 10 2016 0066465

(51) Int. Cl.
| G11C 19/08 | (2006.01) |
| G11C 11/02 | (2006.01) |
| G11C 11/14 | (2006.01) |
| G11C 11/48 | (2006.01) |
| H01F 10/06 | (2006.01) |

(52) U.S. Cl.
CPC .......... *G11C 19/0833* (2013.01); *G11C 11/02* (2013.01); *G11C 11/14* (2013.01); *G11C 11/48* (2013.01); *H01F 10/06* (2013.01)

(58) Field of Classification Search
CPC ...... G11C 19/1833; G11C 11/02; G11C 11/48
See application file for complete search history.

(56) References Cited

U.S. PATENT DOCUMENTS

2013/0134034 A1* 5/2013 Inoue ...................... C23C 14/35
                                                  204/192.15
2016/0071350 A1* 3/2016 Ueyama ................ G01N 27/72
                                                  324/228

* cited by examiner

*Primary Examiner* — Tri Hoang
(74) *Attorney, Agent, or Firm* — Jenkins, Wilson, Taylor & Hunt, P.A.

(57) ABSTRACT

A method of controlling a magnetization state using an imprinting technique may be provided. The method may include moving first and second magnetic structures, which have different magnetization states, toward each other and changing a magnetization state of the first or second magnetic structure, when a distance between the first and second magnetic structures is reduced. A magnetic field, which is produced by a magnetization state of one of the first and second magnetic structures, may be used to align a magnetization state of the other, when the magnetization state of the first or second magnetic structure is changed.

8 Claims, 3 Drawing Sheets

METHOD OF CONTROLLING MAGNETIZATION STATE USING IMPRINTING TECHNIQUE

CROSS-REFERENCE TO RELATED APPLICATIONS

This U.S. non-provisional patent application claims priority under 35 U.S.C. § 119 to Korean Patent Application No. 10-2016-0066465, filed on May 30, 2016, in the Korean Intellectual Property Office, the entire contents of which are incorporated by reference herein.

BACKGROUND

The present disclosure relates to a method of controlling a magnetization state, and in particular, to a simple method of controlling a magnetization state using an imprinting technique.

Recently, due to the rapid development of the information industry, there is a continuing demand for a magnetic storage medium, whose memory capacity is larger than those of conventional magnetic storage media. Accordingly, fine patterns exhibiting electrical conductivity or magnetism based on magnetoresistance may be used for the magnetoresistive film and the magnetic storage medium, and in this case, it may be possible to reduce electric resistance of a device and to increase intensities of reproduction signals to be output from a magnetoresistive-type head.

In such a magnetic storage medium, a size of unit cells or a distance between the unit cells should be reduced to increase an amount of data stored in a given space. However, according to the prior art, it is difficult to reduce such a size or distance. In addition, when it exceeds a certain limit, it becomes difficult to stably store data.

Furthermore, to realize a magnetic storage medium with large capacity, stable writing and good data retention characteristics, a magnetic layer on a substrate may be patterned in the form of a patterned media including a plurality of magnetic patterns, which are physically separated from each other by a specific distance or pitch, and each of which is used to store a one bit, which is the smallest data unit. However, to form the patterned media on the substrate, it is necessary to perform a complex fabrication process including a mask pattern forming step, an etching step, a filling step, and so forth, and the complex fabrication process leads to an increase in the number of defects. Furthermore, in the case where the etching and filling steps are performed on a magnetic layer, the magnetic layer may have an uneven surface, and thus, a planarization process may be further needed. This may further increase the complexity in the fabrication process.

SUMMARY

Some embodiments of the inventive concept provide a method of controlling a magnetization state of a magnetic layer using an imprinting technique, without a complex fabrication process including patterning, etching, filling and planarizing steps. By using this method, it may be possible to stably process a large capacity of data. However, the scope of the inventive concept is not limited thereto.

According to some embodiments of the inventive concept, a method of controlling a magnetization state using an imprinting technique may be provided. The method may include moving a first magnetic structure and a second magnetic structure toward each other, the first and second magnetic structures having different magnetization states, and changing a magnetization state of the first or second magnetic structure, when a distance between the first and second magnetic structures is reduced. A magnetic field, which is produced by a magnetization state of one of the first and second magnetic structures, may be used to align a magnetization state of the other, when the magnetization state of the first or second magnetic structure is changed.

In some embodiments, the moving of the first and second magnetic structures toward each other may include moving the first and second magnetic structures to be spaced apart from each other by a distance close to a size of an atom or to be overlapped with each other.

In some embodiments, when the first magnetic structure has a coercive force that is relatively stronger than that of the second magnetic structure, the magnetization state of the second magnetic structure may be changed by the first magnetic structure.

In some embodiments, when the second magnetic structure has a coercive force that is relatively stronger than that of the first magnetic structure, the magnetization state of the first magnetic structure may be changed by the second magnetic structure.

In some embodiments, when the first magnetic structure or the second magnetic structure has a patterned shape, the magnetization state of the first magnetic structure or the second magnetic structure may be changed at a portion, in which the first and second magnetic structures are adjacent to or overlapped with each other.

In some embodiments, the method may further include moving the first and second magnetic structures away from each other, when the changing of the magnetization state of the first or second magnetic structure is finished.

In some embodiments, the method may further include applying a magnetic field to each of the first and second magnetic structures, before the moving of the first and second magnetic structures toward each other. The applying of the magnetic field may be performed to change a magnetization state of the first magnetic structure and a magnetization state of the second magnetic structure to allow the first and second magnetic structures to have different magnetization directions.

In some embodiments, the first magnetic structure and the second magnetic structure may be provided in the form of a thin film.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

Figure 1:
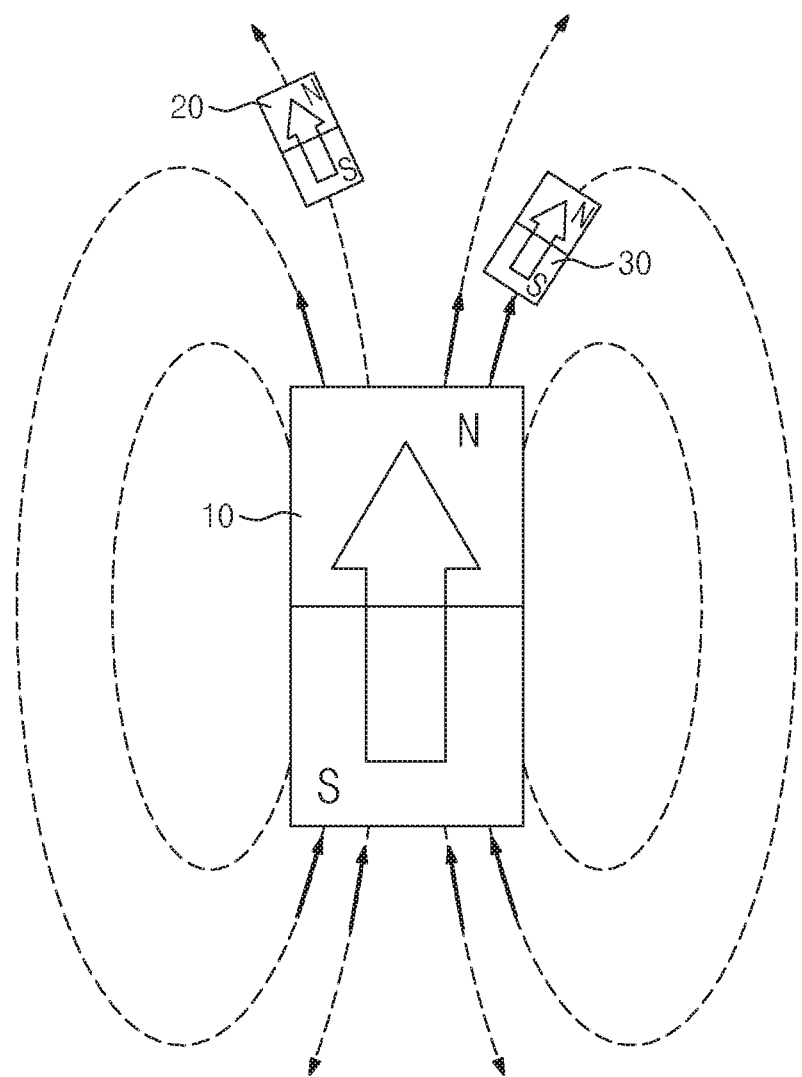
FIG. 1 is a diagram schematically illustrating field lines of a magnetic field, which is generated in a magnetic structure according to some embodiments of the inventive concept.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concept will now be described more fully with reference to the accompanying drawings, in which example embodiments are shown. Example embodiments of the inventive concept may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

FIG. 1 is a diagram schematically illustrating field lines of a magnetic field, which is generated in a magnetic structure according to some embodiments of the inventive concept.

Referring to FIG. 1, a magnetic material may include atoms, each of which has the same properties as a bar magnet. The bar magnet may have a direction from an S pole toward an N pole, and this direction may be oriented in an arbitrary direction; that is, the bar magnet may have a degree of freedom. An atom of a magnetic material may be a degree of freedom like the bar magnet, and this is called 'magnetization direction' or 'spin direction'. When magnetic atoms of a magnetic material have magnetization directions that are arranged, it is referred to as a 'magnetization state' or 'spin state' of the magnetic material. If adjacent atoms in a magnetic material have a property of aligning them in parallel with each other, such a property is called 'ferromagnetism'. If the ferromagnetism in a magnetic material is strong enough to allow adjacent atoms therein to have the same magnetization directions, such a material is called a 'ferromagnetic material'. When atoms in a region of a magnetic material has magnetization directions parallel to each other, such a region is called a 'magnetic domain'. In addition, when a magnetic material is thinly stacked on a plane, it may be called a 'magnetic layer' (hereinafter, a magnetic structure 10).

Depending on a magnetization state of a magnetic material in the magnetic structure 10, a magnetic field may be produced around the magnetic structure 10. For example, a second magnetic structure 20 and a third magnetic structure 30 may be disposed near a first magnetic structure 10, whose magnetization direction is oriented from an S pole toward an N pole. Hereinafter, the first magnetic structure 10 will be supposed to be a magnetic layer, whose coercive force is stronger than those of the second and third magnetic structures 20 and 30. Here, in the case where a distance between each of the second and third magnetic structures 20 and 30 and the first magnetic structure 10 reduces to the size of an atom, due to a magnetic field produced from the first magnetic structure 10, magnetic atoms of the second and third magnetic structures 20 and 30 may be influenced by a magnetic field E and may be aligned to the magnetic field E. Magnetization states of the second and third magnetic structures 20 and 30 may be aligned to have the same direction as that of the first magnetic structure 10. By contrast, in the case where a distance between the first and second magnetic structures 10 and 20 or between the first and third magnetic structures 10 and 30 is much larger than the size of an atom, a magnetic field E caused by a magnetization state of each of the magnetic structure 10, 20, and 30 may influence each other. Here, the magnetic field E may be called a dipolar magnetic field.

In other words, if the second and third magnetic structures 20 and 30 exhibiting a relatively weak coercive force is placed near the first magnetic structure 10 exhibiting a ferromagnetic property, the magnetization direction of the second and third magnetic structures 20 and 30 exhibiting the weak coercive force may be changed due to a magnetic field E produced by the first magnetic structure 10 exhibiting the strong coercive force. In this case, the second and third magnetic structures 20 and 30 exhibiting a weak coercive force may be exerted by a force of aligning it to a direction of the magnetic field E of the first magnetic structure 10 exhibiting a strong coercive force, thereby being re-aligned to a magnetization state different from its initial magnetization state. Here, the magnetic field E may be a force to be produced by an exchange interaction.

Figure 2:
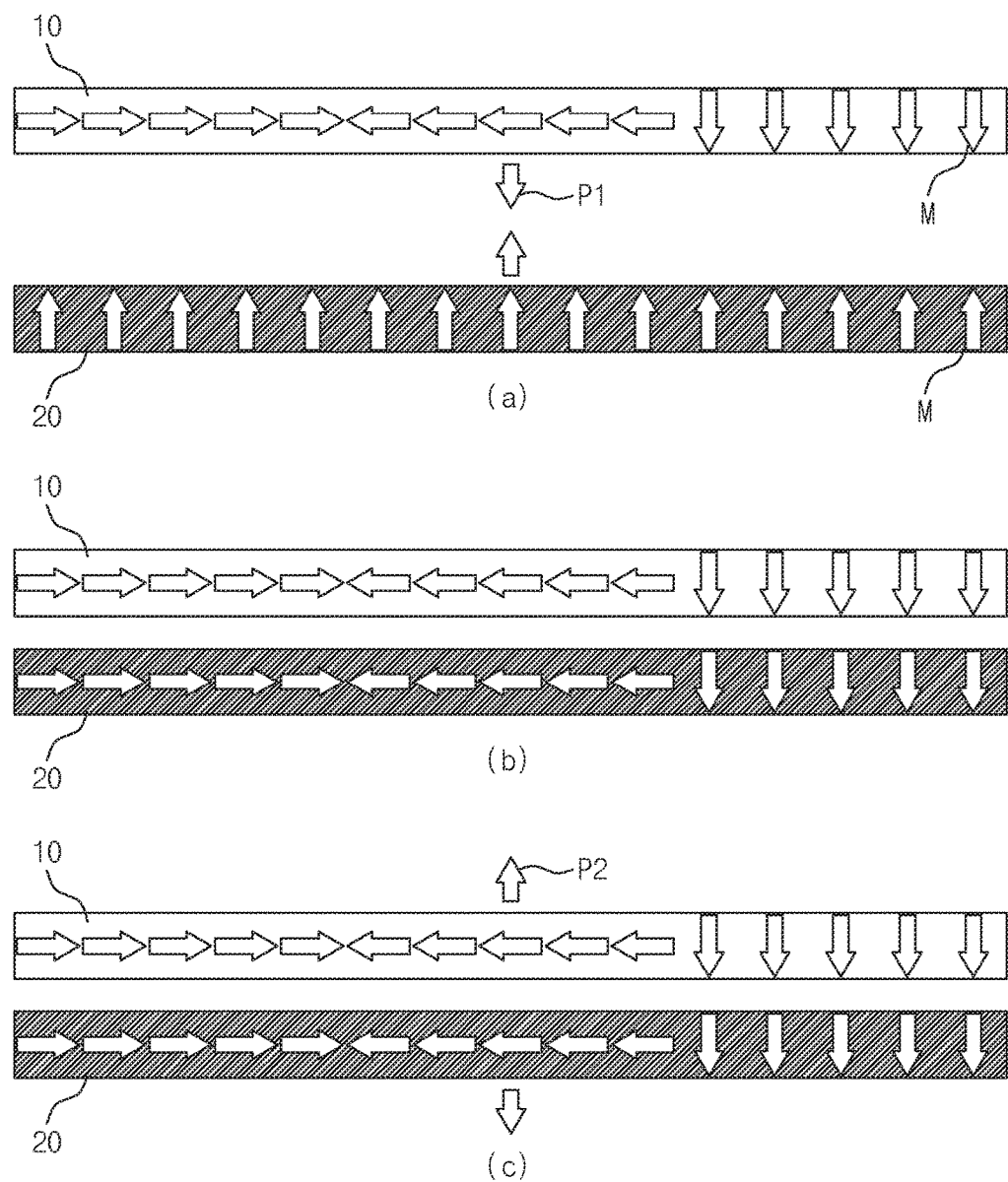
FIG. 2 is a diagram schematically illustrating a method of controlling a magnetization state using an imprinting technique, according to some embodiments of the inventive concept.

FIG. 2 is a diagram schematically illustrating a method of controlling a magnetization state using an imprinting technique, according to some embodiments of the inventive concept.

According to some embodiments of the inventive concept, as shown in FIG. 2, a method of controlling a magnetization state using an imprinting technique may include moving the first and second magnetic structures 10 and 20 toward each other in the direction of the arrow P1 and changing a magnetization state M of the first or second magnetic structure 10 or 20 when a distance between the first and second magnetic structures 10 and 20 is reduced. The first and second magnetic structures 10 and 20 may have different magnetization states. Here, in the case where the magnetization state M of the first or second magnetic structure 10 or 20 is changed, a magnetic field, which is produced from the magnetization state M of one of the first and second magnetic structures 10 and 20, is used to align the magnetization state M of the other.

In a method of controlling a magnetization state using an imprinting technique according to an embodiment of the inventive concept, each of the first and second magnetic structures 10 and 20 may be provided in the form of a thin film, but the inventive concept is not limited thereto. In some embodiments, a magnetic field to be applied to each of the first and second magnetic structures 10 and 20 may be controlled to allow the first and second magnetic structures 10 and 20, which are provided in the form of a thin film, to have magnetization directions different from each other, and this may be used to change an initial magnetization state M of each of the first and second magnetic structures 10 and 20. Here, the first magnetic structure 10 will be assumed to have a relatively strong coercive force, compared with that of the second magnetic structure 20.

The first and second magnetic structures 10 and 20 with different magnetization states M may be spaced apart from each other by a distance close to the size of an atom. Here, due to the first magnetic structure 10, the magnetization state of the second magnetic structure 20 may be changed to have the same magnetization direction as that of the first magnetic structure 10, as depicted by FIG. 2 (b). If the change in the magnetization state M of the second magnetic structure 20 is finished, the first and second magnetic structures 10 and 20 may be moved away from each other, and as a result, the magnetization state M of the second magnetic structure 20 may be maintained.

In a method of controlling a magnetization state using an imprinting technique according to another embodiment of the inventive concept, each of the first and second magnetic structures 10 and 20 may be provided in the form of a thin film, but the inventive concept is not limited thereto. In some embodiments, a magnetic field to be applied to each of the first and second magnetic structures 10 and 20 may be controlled to allow the first and second magnetic structures 10 and 20, which are provided in the form of a thin film, to have magnetization directions different from each other, and this may be used to change an initial magnetization state M of each of the first and second magnetic structures 10 and 20. Here, the first magnetic structure 10 will be assumed to have a relatively strong coercive force, compared with that of the second magnetic structure 20.

The first and second magnetic structures 10 and 20 with different magnetization states M may be disposed to be overlapped with each other. In this case, as depicted by FIG. 2(b), due to the first magnetic structure 10, the magnetization state M of the second magnetic structure 20 may be copied to have the same shape as that of the magnetization direction of the first magnetic structure 10. Thereafter, the first and second magnetic structures 10 and 20 may be moved away from each other in the direction of the arrow P2, and as a result, the magnetization state of the second magnetic structure 20 may be maintained.

In a method of controlling a magnetization state using an imprinting technique according to other embodiment of the inventive concept, each of the first and second magnetic structures 10 and 20 may be provided in the form of a thin film, but the inventive concept is not limited thereto. In some embodiments, a magnetic field to be applied to each of the first and second magnetic structures 10 and 20 may be controlled to allow the first and second magnetic structures 10 and 20, which are provided in the form of a thin film, to have magnetization directions different from each other, and this may be used to change an initial magnetization state M of each of the first and second magnetic structures 10 and 20. Here, the second magnetic structure 20 will be assumed to have a relatively strong coercive force, compared with that of the first magnetic structure 10.

The first and second magnetic structures 10 and 20 with different magnetization states may be disposed to be spaced apart from each other by a distance close to the size of an atom. Here, although not shown, due to the second magnetic structure 20, the magnetization state of the first magnetic structure 10 may be changed to have the same shape as that of the magnetization direction of the second magnetic structure 20. Even when the first and second magnetic structures 10 and 20 with different magnetization states are disposed to be overlapped with each other, due to the second magnetic structure 20, the magnetization state of the first magnetic structure 10 may be changed to have the same magnetization direction as that of the second magnetic structure 20.

Figure 3:
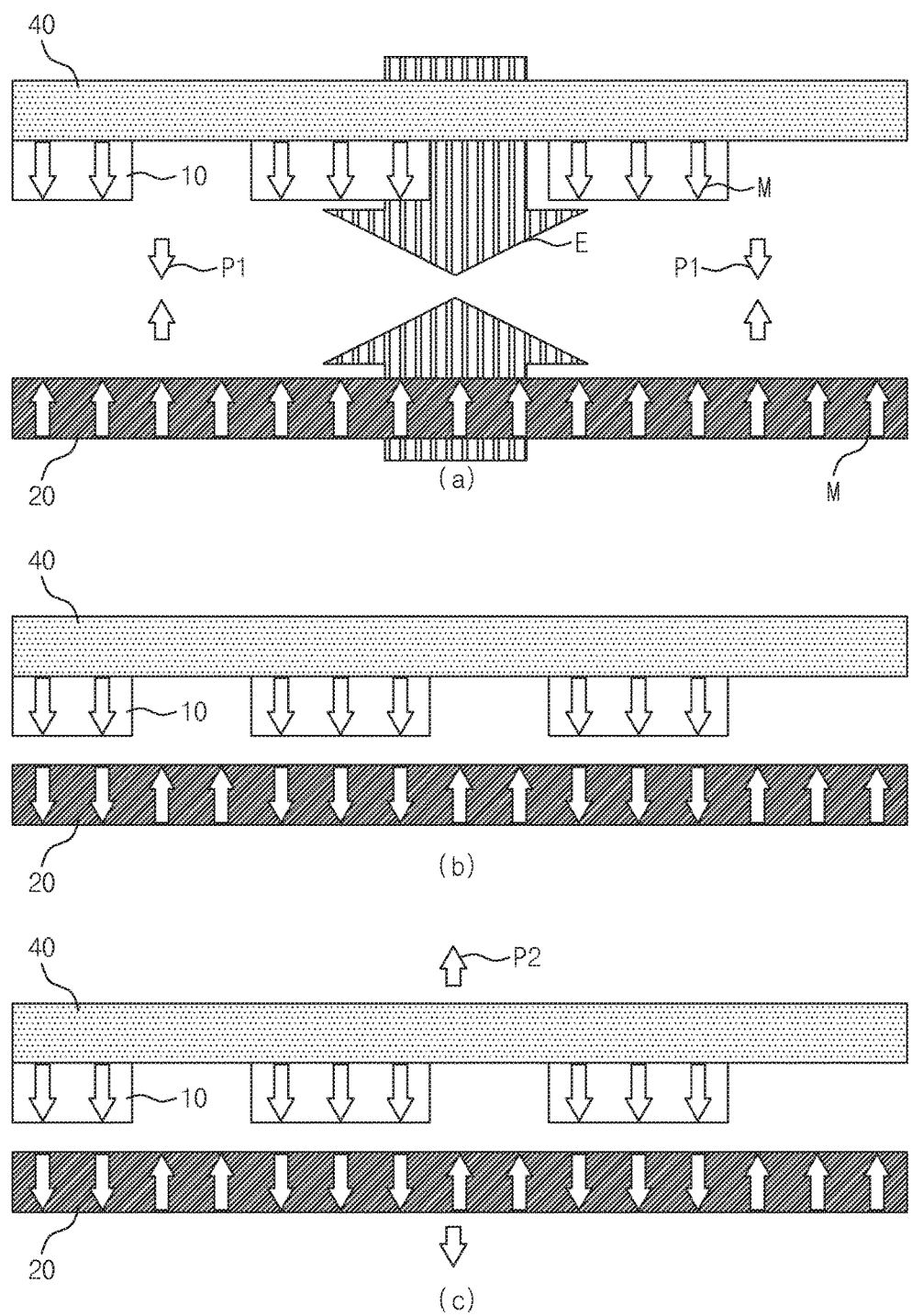
FIG. 3 is a diagram schematically illustrating a method of controlling a magnetization state using an imprinting technique, according to other embodiments of the inventive concept.

FIG. 3 is a diagram schematically illustrating a method of controlling a magnetization state using an imprinting technique, according to other embodiments of the inventive concept.

According to other embodiments of the inventive concept, as shown in FIG. 3, a method of controlling a magnetization state using an imprinting technique may be applied to a first magnetic structure 10 or a second magnetic structure 20, which is formed to have a patterned shape. For example, in the case where the first magnetic structure 10 is a patterned magnetic layer, the first magnetic structure 10 may be fixedly attached to a substrate 40. Here, the substrate 40 may be formed of a material that does not cause a change in magnetization state of the first magnetic structure 10. By applying a magnetic field E to each of the first and second magnetic structures 10 and 20 in a direction of the arrow, it may be possible to allow the first and second magnetic structures 10 and 20 to have different magnetization directions and, moreover, to change an initial magnetization state M of each of the first and second magnetic structures 10 and 20.

The first and second magnetic structures 10 and 20 with different magnetization states M may be disposed to be spaced apart from each other by a distance close to the size of an atom or may be moved to be overlapped with each other, in an arrow direction P1. Here, the first magnetic structure 10 with the patterned shape should have a relatively strong coercive force, compared with the second magnetic structure 20 having an un-patterned shape. If the first magnetic structure 10 having a strong coercive force and an un-patterned shape is adjacent to the second magnetic structure 20 having a relatively weak coercive force and a patterned shape, there may be no change in a magnetization state of the first magnetic structure 10 with the relatively strong coercive force, and thus, a magnetic pattern may not be formed in the first magnetic structure 10. Accordingly, if the second magnetic structure 20 has a patterned shape, the second magnetic structure 20 should have a relatively strong coercive force, compared with the first magnetic structure 10.

As depicted by FIG. 3 (c), due to the first magnetic structure 10, the magnetization state M of the second magnetic structure 20 may be changed to have the same magnetization direction as that of the first magnetic structure 10, at only the region in which the first and second magnetic structures 10 and 20 are adjacent to or overlapped with each other. If the change in the magnetization state M of the second magnetic structure 20 is finished, the first and second magnetic structures 10 and 20 may be moved away from each other in the direction of the arrow P2, and thus, magnetic patterns may be formed in the second magnetic structure 20, allowing it to serve as a large-capacity data storage device.

As described above, in the method of controlling a magnetization state using an imprinting technique according to some embodiments of the inventive concept, the first and second magnetic structures 10 and 20 with different magnetization states may be moved toward each other to allow a magnetization state of one of the first and second magnetic structures 10 and 20 to have the same magnetization state as that of the other. Thus, it may be possible to easily or freely form magnetic patterns in a magnetic layer using an imprinting technique, without a complex fabrication process.

In the afore-described embodiments, only two magnetic structures are used to control a magnetization state of a magnetic layer, but depending on a shape of a magnetic pattern or a length or shape of the magnetic structure, it may be possible to change the number of the magnetic structure or to control an intensity or direction of a magnetic field, which is used to align an initial magnetization state of the magnetic structure. This may be used to achieve various magnetic shapes.

It may be possible to easily form a magnetic pattern at a specific position, and thus, by controlling the magnetization state, it may be possible to easily control an on-state and an off-state. This method can be used to realize a magnetic device including a memory device.

According to some embodiments of the inventive concept, a method of controlling a magnetization state using an imprinting technique can be realized through a cost-effective and simple fabrication process. Furthermore, it may be possible to prevent defects from occurring and to stably control a magnetization state of a magnetic material. However, the scope of the inventive concept is not limited thereto.

While example embodiments of the inventive concepts have been particularly shown and described, it will be understood by one of ordinary skill in the art that variations in form and detail may be made therein without departing from the spirit and scope of the attached claims.

What is claimed is:

1. A method of controlling a magnetization state using an imprinting technique, the method comprising:
    moving a first magnetic structure and a second magnetic structure toward each other, the first and second magnetic structures having different magnetization states;
    changing a magnetization state of the first or second magnetic structure when a distance between the first and second magnetic structures is reduced; and
    using a magnetic field produced by a magnetization state of one of the first and second magnetic structures to align a magnetization state of another of the first and second magnetic structures when the magnetization state of the first or second magnetic structure is changed,
    wherein, when the first magnetic structure or the second magnetic structure has a patterned shape, the magnetization state of the first magnetic structure or the second magnetic structure is changed at a portion, in which the first and second magnetic structures are adjacent to or overlapped with each other.

2. The method of claim 1, wherein moving the first and second magnetic structures toward each other comprises moving the first and second magnetic structures to be spaced apart from each other by a distance close to a size of an atom or to be overlapped with each other.

3. The method of claim 1, wherein, when the first magnetic structure has a coercive force that is relatively stronger than that of the second magnetic structure, the magnetization state of the second magnetic structure is changed by the first magnetic structure.

4. The method of claim 1, wherein, when the second magnetic structure has a coercive force that is relatively stronger than that of the first magnetic structure, the magnetization state of the first magnetic structure is changed by the second magnetic structure.

5. The method of claim 1, wherein the first magnetic structure and the second magnetic structure are in a form of a thin film.

6. The method of claim 1, comprising moving the first and second magnetic structures away from each other when the changing of the magnetization state of the first or second magnetic structure is finished.

7. A method of controlling a magnetization state using an imprinting technique, the method comprising:
    moving a first magnetic structure and a second magnetic structure toward each other, the first and second magnetic structures having different magnetization states;
    changing a magnetization state of the first or second magnetic structure when a distance between the first and second magnetic structures is reduced;
    using a magnetic field produced by a magnetization state of one of the first and second magnetic structures to align a magnetization state of another of the first and second magnetic structures when the magnetization state of the first or second magnetic structure is changed; and
    applying a magnetic field to each of the first and second magnetic structures, before the moving of the first and second magnetic structures toward each other,
    wherein the applying of the magnetic field is performed to change a magnetization state of the first magnetic structure and a magnetization state of the second magnetic structure to allow the first and second magnetic structures to have different magnetization directions.

8. The method of claim 7, wherein the first magnetic structure and the second magnetic structure are in a form of a thin film.

* * * * *